(12) United States Patent
Lee et al.

(10) Patent No.: US 8,481,663 B2
(45) Date of Patent: Jul. 9, 2013

(54) RESIST COPOLYMERS CONTAINING PHOTOACID GENERATORS FOR LITHOGRAPHIC APPLICATIONS AND ITS METHOD OF PREPARATION

(75) Inventors: Haiwon Lee, Seoul (KR); Meehye Jeong, Busan (KR); Ashok D. Sagar, Seoul (KR)

(73) Assignee: IUCF-HYU (Industry-University Cooperation Foundation Hanyang University), Seoul (KR)

( * ) Notice: Subject to any disclaimer, the term of this patent is extended or adjusted under 35 U.S.C. 154(b) by 573 days.

(21) Appl. No.: 12/312,231

(22) PCT Filed: Feb. 11, 2009

(86) PCT No.: PCT/KR2009/000628
§ 371 (c)(1),
(2), (4) Date: May 14, 2009

(87) PCT Pub. No.: WO2010/021442
PCT Pub. Date: Feb. 25, 2010

(65) Prior Publication Data
US 2011/0098433 A1    Apr. 28, 2011

(30) Foreign Application Priority Data
Aug. 18, 2008  (KR) .......................... 10-2008-0080543

(51) Int. Cl.
*C08F 12/30* (2006.01)
(52) U.S. Cl.
USPC .......................................... 526/286; 526/243
(58) Field of Classification Search
USPC .......................................................... 526/286
See application file for complete search history.

(56) References Cited

U.S. PATENT DOCUMENTS
5,981,141 A    11/1999  Choi et al.

FOREIGN PATENT DOCUMENTS
| KR | 10-0230417 | 8/1999 |
| KR | 10-0637450 | 10/2006 |
| KR | 10-0823471 | 4/2008 |
| WO | WO 2006/088317 | * 8/2006 |
| WO | WO 2006/088317 A1 | 8/2006 |

OTHER PUBLICATIONS

Korean Patent Abstracts of Publication No. 1020060091911 corresponding to Korean Registration No. 10-0637450, listed above.
Sugimura, Hiroyuki, et al., "Scanning probe anodization: Nanolithography using thin films of anodically oxidizable materials as resists," J. Vac. Sci. Technol. A 14(3), May/Jun. 1996, pp. 1223-1227.
Jegadesan, Subbiah, et al., "Easy Writing of Nanopatterns on a Polymer Film Using Electrostatic Nanolithography," Small, 2(4), 2006, pp. 481-484.

(Continued)

*Primary Examiner* — Doris Lee
(74) *Attorney, Agent, or Firm* — Christie, Parker & Hale, LLP (57) ABSTRACT

Disclosed is a copolymer suitable for use as a resist for atomic force microscope (AFM) lithography or e-beam lithography. The copolymer contains fluoroalkylsulfonium salts as photoacid generators. The copolymer has high solubility in organic solvents and high coating ability. In addition, the copolymer can be patterned with high sensitivity and resolution by lithography. Further disclosed is a method of preparation for the copolymer.

3 Claims, 5 Drawing Sheets
(1 of 5 Drawing Sheet(s) Filed in Color)

OTHER PUBLICATIONS

Jegadesan, Subbiah, et al., "Electrochemically Nanopatterned Conducting Coronas of a Conjugated Polymer Precursor: SPM Parameters and Polymer Composition," Langmuir, 22, 2006, pp. 3807-3811.

Jegadesan, Subbiah, et al., "Fabrication of Nanostructure on a Polymer Film Using Atomic Force Microscope," J. Nanosci. Nanotechnol., 7(6), 2007, pp. 2172-2175.

Morisawa, Taku, et al., "Chemically Amplified Si-contained Resist Using Silsesquoxane for ArF Lithography (CASUAL) and its Application to Bi-Layer Resist Process," Journal of Photopolymer Science and Technology, 10(4), 1997, pp. 589-594.

Kim, Young-Dae, et al., "New Bilayer Positive Photoresist for 193 nm Photolithography," Mol. Cryst. Liq. Cryst. 327, 1999, pp. 279-282.

* cited by examiner

FWHM 133 nm
Height 1.8 nm

Figure 6

FWHM 167 nm
Height 4.2 nm

US 8,481,663 B2

RESIST COPOLYMERS CONTAINING PHOTOACID GENERATORS FOR LITHOGRAPHIC APPLICATIONS AND ITS METHOD OF PREPARATION

CROSS-REFERENCE TO RELATED APPLICATION

This application is a National Phase Patent Application of International Application Number PCT/KR2009/000628, filed on Feb. 11, 2009, which claims priority of Korean Patent Application Number 10-2008-0080543, filed on Aug. 18, 2008.

TECHNICAL FIELD

The present invention relates to a copolymers suitable for use as a resist for atomic force microscope (AFM) lithography or e-beam lithography, and its method of preparation. More specifically, the copolymer containing fluoroalkylsulfonium salts as photoacid generators exhibits excellent solubility in many organic solvents with high coating ability required for lithographic process, with improved sensitivity and resolution.

BACKGROUND ART

Atomic force microscope (AFM) is a kind of scanning probe microscope (SPM). AFM is a high-precision measurement instrument in which a force necessary for the interaction such as an attractive or repulsive force between a sharp probe and a sample surface is used to analyze the sample surface with resolution on atomic-level. Atomic force microscopy has recently attracted much attention as a promising method for hyper-fine pattern formation. A general application of AFM is to shape the surface of a sample without damaging the sample.

When a force is applied to damage the surface of a sample to some extent, atomic and molecular arrangements on the sample surface can be manipulated. This technique is termed 'nanolithography'. An artificial nanostructure can be constructed on the surface of a sample using nanolithography to control physical parameters (such as electron density and energy level) of the sample on a nanometer scale.

Various methods associated with the use of AFM are currently being investigated in the field of nanolithography, for example, a method for forming a hyper-fine pattern using a resist material and a method for forming an oxide pattern on the surface of a hydrogen-passivated Si-wafer or poly-Si by an electric field of an AFM tip. Nanolithography combined together with electrostatic force microscopy (EFM) and scanning capacitance microscopy (SCM) can be used for next-generation database applications.

The mechanism of the formation of an oxide pattern using an AFM is briefly summarized as follows. An organic thin film of a predetermined thickness is formed on a silicon substrate and a voltage of several volts is applied locally to the organic thin film using an AFM tip to form an oxide pattern. A resist layer of the portion of the organic thin film to which the voltage has been applied is crosslinked. During the crosslinking, Si atoms react with moisture in the air to form $SiO_x$, which protrudes from the resist thin film. This reaction mechanism is shown below (see J. Vac. Sci. Technol. A14 (3), 1996, 1223).

(Reaction Mechanism)
AFM Tip (Cathode Reaction)

Silicon Substrate (Anode Reaction)

However, the silicon oxide can be etched at a much higher rate than the other portions because of its very loose structure. The portion of the organic thin film to which the voltage has not been applied is dissolved in a developing solution and the portion to which the voltage has been applied remains undissolved as a pattern.

Factors considered to be important in AFM lithography are an applied voltage, an electric current, a scan rate, a humidity, etc. If lithography is performed under non-optimal conditions to form a pattern, the line width of the pattern is irregular and the pattern line is disconnected. A better pattern can be formed when a high-performance resist is used and the lithography conditions (including an applied voltage, a scan rate, a humidity, etc.) are optimized. The formation of a uniform thin film is also very important.

The present invention has succeeded in developing a high-sensitivity, high-resolution resist that can be applied to a large-area substrate by spin coating in an easy manner and can be patterned to have a line width of 0.1 μm or less. A further improvement of optimum processing conditions using the resist material will enable the formation of hyper-fine pattern whose line width is in the order of a few nanometers. Therefore, it is anticipated that technology associated with the use of the resist material would provide an important base for the development of terabit-scale semiconductor memories and other device applications, including displays and nano-biodevices, based on ultra-thin film patterning techniques.

The present invention features the applicability as a resist for both e-beam lithography and for AFM lithography. A photosensitive resist (or a photosensitive polymer) is an organic photosensitive material that is necessarily used in the manufacturing processes of a variety of high-precision electronic information industrial products. A photosensitive resist is a generic term for polymer composition systems that absorb incident light or radiation energy and undergo physicochemical changes. Resists for the processing of hyper-fine shapes are important materials that are currently used in advanced printing, semiconductor and electronic information industries. Resists are widely used as photocurable materials and photosensitive materials for surface coating and pattern formation.

AFM-based lithographic processes and resists used therefor are well known in the literature (Small, 2006, 2, 481-484, S. Jegadesan; S. Valiyaveettill, Easy Writing of Nanopatterns on a Polymer Film Using Electrostatic Nanolithography and Langmuir 2006, 22, 3807-3811, Subbiah Jegadesan; Prasad Taranekar; Swaminathan Sindhu; Rigoberto C. Adrincula; Suresh Valiyaveettil, Electrochemically Nanopatterned Conducting Coronas of a Conjugated Polymer Precursor; SPM Parameters and Polymer Composition Journal of Nanoscience and Nanotechnology, 2007, 7, 2172-2175, S. Jegadesan; S. Sindhu; S. Valiyaveettil, Fabrication of Nanostructure on a Polymer Film Using Atomic Force Microscope).

The present inventor has developed 1,3-bis(trimethylsilyl) isopropyl methacrylate (BPMA) as a silicon-containing monomer and filed a patent application (U.S. Ser. No. 08/942, 249 published on September 1999). Further, the present inventor has developed and reported resists using the monomer (J. Photopolymer. Science and Technology, No. 4, Vol. 10, 1997, Kang, Y. J., Lee, H. et al. Chemically Amplified Silicon Containing Resist for ArF Excimer Laser Lithography, p 585; Mol. Cryst. Liq. Cryst., 1999, 327, Kim, Y. D., Lee, H. et al. New Bilayer Positive Photoresists for 193 nm Photolithography, p. 279; and Korean Patent Registration No. 10-1999-230417 published on Nov. 15, 1999).

Further, the present inventor has developed a compound substituted with a fluoroalkylsulfonium salt as a photoacid generator and a copolymer thereof (Korean Patent No. 0637450 and PCT/KR 2006/000535), and a compound having fluoroalkylsulfonium salts as photoacid generators introduced into the side chain of the compound, and a homopolymer thereof (Korean Patent No. 0823471). Thereafter, the present inventor has earnestly and intensively conducted research to develop a resist copolymer with higher sensitivity and resolution than the known copolymer, and finally accomplished the present invention.

DISCLOSURE

Technical Problem

A first objective of the present invention is to provide a copolymer suitable for use as a resist for AFM lithography or e-beam lithography that contains photoacid generators wherein the copolymer is easily crosslinked even at a low voltage to achieve high resolution and is thus capable of forming a hyper-fine pattern at a high speed.

A second objective of the present invention is to provide a method for the preparation of the copolymer.

Technical Solution

According to the present invention, the first objective can be accomplished by the provision of a resist copolymer containing photoacid generators, represented by Formula 1 or 2:

(1)

wherein $R_1$ and $R_2$ are independently selected from $C_1$-$C_6$ alkylcarbonyl, aldehyde, cyano, nitro and phenyl groups, $R_3$ is a $C_1$-$C_{20}$ linear, branched or cyclic alkyl group, $R_4$ is selected from hydrogen, methyl, cyclopentyl, t-BOC styrene, methoxy, methoxyethyl, methoxypropyl and propylene oxide, $R_5$, $R_6$ and $R_7$ are independently a hydrogen atom or a $C_1$-$C_{20}$ linear, branched or cyclic alkyl group, n is an integer from 0 to 20, and the sum of x, y and z is 1; or (2)

wherein $R_1$ and $R_2$ are independently selected from $C_1$-$C_6$ alkylcarbonyl, aldehyde, cyano, nitro and phenyl groups, $R_4$ is selected from hydrogen, methyl, cyclopentyl, t-BOC styrene, methoxy, methoxyethyl, methoxypropyl and propylene oxide, $R_6$ and $R_7$ are independently a hydrogen atom or a $C_1$-$C_{20}$ linear, branched or cyclic alkyl group, n is an integer from 0 to 20, and the sum of p and q is 1.

In an embodiment, the resist copolymer may be a copolymer containing glycidylmethacrylate monomer units, represented by Formula 3 or 4:

(3)

wherein x+y+z=1; or (4)

wherein p+q=1.

In a preferred embodiment, the resist copolymer may be a resist copolymer for AFM lithography or e-beam lithography.

According to the present invention, the second objective can be accomplished by the provision of a method for preparing a resist copolymer of Formula 1 or 2, as depicted in Reaction 1 or 2:

(1)

wherein $R_1$ and $R_2$ are independently selected from $C_1$-$C_6$ alkylcarbonyl, aldehyde, cyano, nitro and phenyl groups, $R_3$ is a $C_1$-$C_{20}$ linear, branched or cyclic alkyl group, $R_4$ is selected from hydrogen, methyl, cyclopentyl, t-BOC styrene, methoxy, methoxyethyl, methoxypropyl and propylene oxide, $R_5$, $R_6$ and $R_7$ are independently a hydrogen atom or a $C_1$-$C_{20}$ linear, branched or cyclic alkyl group, n is an integer from 0 to 20, and the sum of x, y and z is 1; or Reaction 2

(2)

wherein $R_1$ and $R_2$ are independently selected from $C_1$-$C_6$ alkylcarbonyl, aldehyde, cyano, nitro and phenyl groups, $R_4$ is selected from hydrogen, methyl, cyclopentyl, t-BOC styrene, methoxy, methoxyethyl, methoxypropyl and propylene oxide, $R_6$ and $R_7$ are independently a hydrogen atom or a $C_1$-$C_{20}$ linear, branched or cyclic alkyl group, n is an integer from 0 to 20, and the sum of p and q is 1.

In an embodiment, the resist copolymer may be a terpolymer of Formula 3 containing glycidylmethacrylate monomer units, which is prepared as depicted in Reaction 3:

Reaction 3 wherein x+y+z=1.

In an embodiment, the resist copolymer may be a copolymer of Formula 4 containing glycidylmethacrylate monomer units, which is prepared as depicted in Reaction 4:

wherein p+q=1.

DESCRIPTION OF DRAWINGS

The patent or application file contains at least one drawing executed in color. Copies of this patent or application publication with color drawing(s) will be provided by the Office upon request and payment of the necessary fee.

In the figures.

BEST MODE

Exemplary embodiments of the present invention will now be described in detail.

The present invention provides a resist copolymer containing photoacid generators, represented by Formula 1 or 2:

wherein $R_1$ and $R_2$ are independently selected from $C_1$-$C_6$ alkylcarbonyl, aldehyde, cyano, nitro and phenyl groups, $R_3$ is a $C_1$-$C_{20}$ linear, branched or cyclic alkyl group, $R_4$ is selected from hydrogen, methyl, cyclopentyl, t-BOC styrene, methoxy, methoxyethyl, methoxypropyl and propylene oxide, $R_5$, $R_6$ and $R_7$ are independently a hydrogen atom or a $C_1$-$C_{20}$ linear, branched or cyclic alkyl group, n is an integer from 0 to 20, and the sum of x, y and z is 1; or wherein $R_1$ and $R_2$ are independently selected from $C_1$-$C_6$ alkylcarbonyl, aldehyde, cyano, nitro and phenyl groups, $R_4$ is selected from hydrogen, methyl, cyclopentyl, t-BOC styrene, methoxy, methoxyethyl, methoxypropyl and propylene oxide, $R_6$ and $R_7$ are independently a hydrogen atom or a $C_1$-$C_{20}$ linear, branched or cyclic alkyl group, n is an integer from 0 to 20, and the sum of p and q is 1. The present invention also provides a method for preparing a resist copolymer of Formula 1 or 2, as depicted in Reaction 1 or 2:

(1)

wherein $R_1$ and $R_2$ are independently selected from $C_1$-$C_6$ alkylcarbonyl, aldehyde, cyano, nitro and phenyl groups, $R_3$ is a $C_1$-$C_{20}$ linear, branched or cyclic alkyl group, $R_4$ is selected from hydrogen, methyl, cyclopentyl, t-BOC styrene, methoxy, methoxyethyl, methoxypropyl and propylene oxide, $R_5$, $R_6$ and $R_7$ are independently a hydrogen atom or a $C_1$-$C_{20}$ linear, branched or cyclic alkyl group, n is an integer from 0 to 20, and the sum of x, y and z is 1; or Reaction 2

(2)

wherein $R_1$ and $R_2$ are independently selected from $C_1$-$C_6$ alkylcarbonyl, aldehyde, cyano, nitro and phenyl groups, $R_4$ is selected from hydrogen, methyl, cyclopentyl, t-BOC styrene, methoxy, methoxyethyl, methoxypropyl and propylene oxide, $R_6$ and $R_7$ are independently a hydrogen atom or a $C_1$-$C_{20}$ linear, branched or cyclic alkyl group, n is an integer from 0 to 20, and the sum of p and q is 1.

A typical sulfonium salt is used as a photoacid initiator or radical photoinitiator in polymerization or as an acid catalyst generator for the deprotection of an organic compound. Sulfonium salts are sensitive to UV light in a specific region to generate cationic photoacid initiators. Sulfonium salts have been developed in various applications which could not be achieved by conventional radical curing processes.

A compound substituted with a fluoroalkylsulfonium salt as a photoacid generator and a copolymer thereof, in which the fluoroalkylsulfonium salts are introduced into the side chains thereof, are highly soluble in organic solvents and have the ability to be photopolymerized due to the presence of the sulfonium salt.

According to the method of the present invention, the copolymer is prepared in accordance with the following procedure. First, a monomer is prepared in which a fluoroalkylsulfonium salt as a photoacid generator is introduced into the side chain. Then, the monomer is reacted with one or more acrylate monomers to prepare the desired copolymer. The monomer having a fluoroalkylsulfonium salt as a photoacid generator introduced at the side chain thereof may be represented by Formula 5:

(5)

The monomer of Formula 5 may be 4-(biphenylsulfoniumtriflate)benzyl methacrylate. The acrylate monomers may be glycidylmethacrylate and methylmethacrylate. The resist copolymer of the present invention is prepared by dissolving the monomers in tetrahydrofuran and polymerizing under stirring at a constant temperature.

Hereinafter, the present invention will be explained in more detail with reference to the following examples. However, these examples are not intended to limit the scope of the invention.

The copolymer of Formula 1 or 2 is synthesized by the following procedure. First, a monomeric compound of Formula 5 substituted with a fluoroalkylsulfonium salt as a photoacid generator is prepared.

(5)

The compound of Formula 5 can be synthesized by two methods. The first synthesis method is carried out in three steps, which was developed by the present inventor and is described in Korean Patent No. 10-637450. Specifically, the first synthesis method comprises synthesizing an alkylsulfonium triflate from diphenyl sulfoxide (first step), synthesizing a halogen-substituted alkylsulfonium triflate (second step), and synthesizing an alkylacryloyloxy alkylsulfonium triflate (third step). However, this synthesis method involves the multiple complicated steps, requires a long reaction time, and has the problem that the monomers are not completely separated from the product during purification. A further improvement of the first method was developed by the present inventor. According to the improved method, a monomeric compound substituted with a fluoroalkylsulfonium salt as a photoacid generator is synthesized in a single step, which is disclosed in Korean Patent No. 10-823471.

The second method is employed in the present invention, but it is to be understood that any monomeric compound having the structure of Formula 5 may be used for the synthesis of the resist copolymer according to the present invention, regardless of which synthesis method is used.

MODE FOR INVENTION

EXAMPLES

Example 1

Synthesis of Monomeric Compound Substituted with Photoacid Generator

In this example, 4-(biphenylsulfoniumtriflic)benzyl methacrylate was synthesized as a monomeric compound substituted with a photoacid generator.

10 g (49.4 mmol) of diphenyl sulfoxide and 8.7 g (49.4 mmol) of methacryloyl benzyl were dissolved in 500 mL of dichloromethane. After the temperature of a reactor containing the solution was adjusted to about −78° C. in an acetone-dry ice bath, 16.72 g (59.28 mmol) of trifluoromethanesulfonic (triflic) anhydride was slowly added dropwise thereto. After the addition was finished, stirring was performed at the same temperature for 1 hour and continued for 30 minutes while slowly raising the temperature to room temperature. The reaction solution was sequentially washed with a saturated sodium bicarbonate solution and distilled water, and dried over anhydrous magnesium sulfate. The solvent was removed using a rotary evaporator. The residue was purified by column chromatography, affording 4-(biphenylsulfoniumtriflate)benzyl methacrylate in a yield of 60%.

The structure of the monomeric compound was identified by $^1$H-NMR. The spectroscopic data for the monomeric compound are as follows.

$^1$H-NMR (CDCl$_3$, ppm): 1.97 (s, 1H, C—CH$_3$), 5.28 (2H, O—CH$_3$), 5.64 (1H, CH$_2$=), 6.66 (1H, CH$_2$=), 7.70 (14H, phenyl)

Example 2

Synthesis of Copolymer Containing Photoacid Generators

In this example, a copolymer containing photoacid generators was synthesized as depicted in the following reaction.

1.137 g (8 mol) of glycidylmethacrylate and 1.00 g (1 mol) of 4-(biphenylsulfoniumtriflic)benzyl methacrylate were dissolved in 300 ml of tetrahydrofuran. To the solution was added dropwise AIBN (0.1 mol) as an initiator. Stirring was continued for 24 hours while maintaining the reactor at about 50-70° C. using a circulator. After completion of the stirring, the reaction solution was evaporated to remove the tetrahydrofuran and then an appropriate amount of methylene chloride was added thereto. Reprecipitation with a mixture of isopropanol and hexane (7:3-5:5 (v/v)) gave the copolymer.

Figure 1:
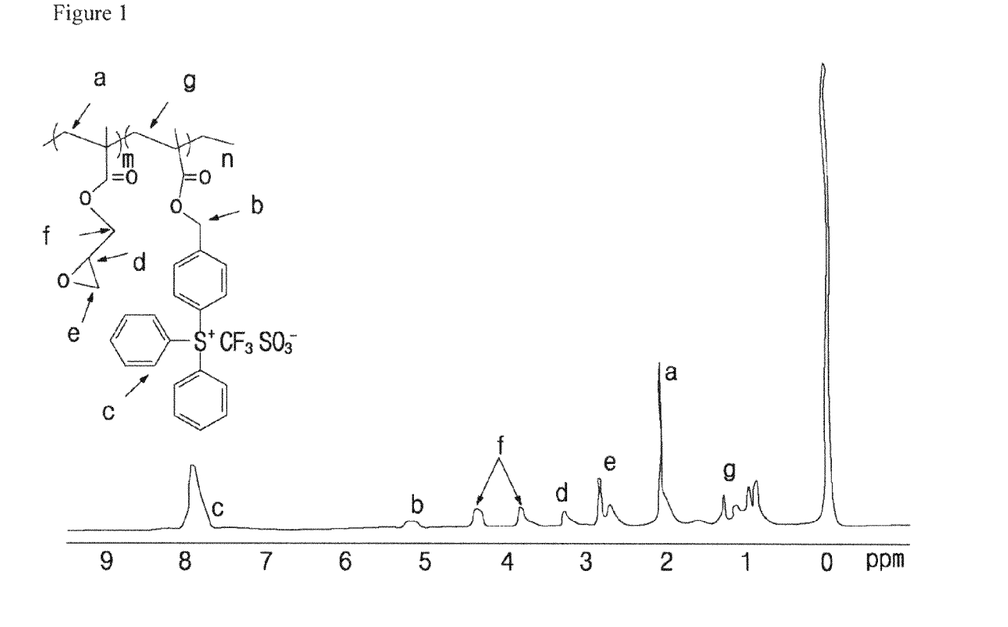
FIG. 1 is a $^1$H-NMR spectrum of a copolymer synthesized in Example 2.
Figure 2:
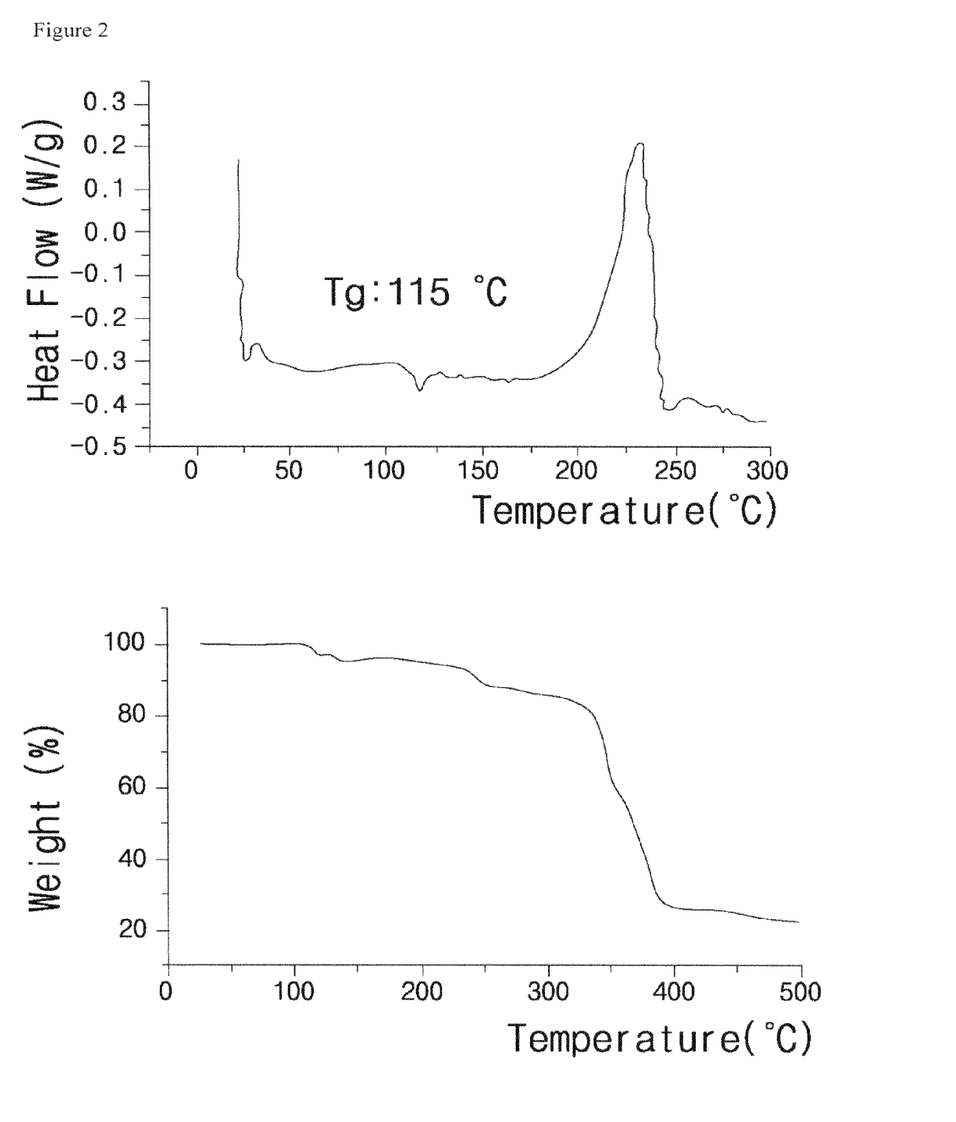
FIG. 2 shows the results of thermogravimetric analysis (DSC and TGA) of a copolymer synthesized in Example 2.

FIGS. 1 and 2 show a $^1$H-NMR spectrum and the results of thermogravimetric analysis (DSC and TGA) of the copolymer, respectively.

Example 3

Synthesis of Terpolymer Containing Photoacid Generators

In this example, a terpolymer containing glycidylmethacrylate monomer units was synthesized as depicted in the following reaction.

0.1 g (0.7 mmol) of glycidylmethacrylate, 0.8 g (8.0 mmol) of methylmethacrylate and 0.1 g (0.2 mmol) of 4-(biphenylsulfoniumtriflic)benzyl methacrylate were dissolved in 350 ml of tetrahydrofuran. To the solution was added dropwise AIBN (0.5 mol) as an initiator. Stirring was continued for 24 hours while maintaining the reactor at about 50-70° C. using a circulator. After completion of the stirring, the reaction solution was evaporated to remove the tetrahydrofuran and then an appropriate amount of methylene chloride was added thereto. Reprecipitation with a mixture of isopropanol and hexane (7:3-5:5 (v/v)) gave the terpolymer.

Figure 3:
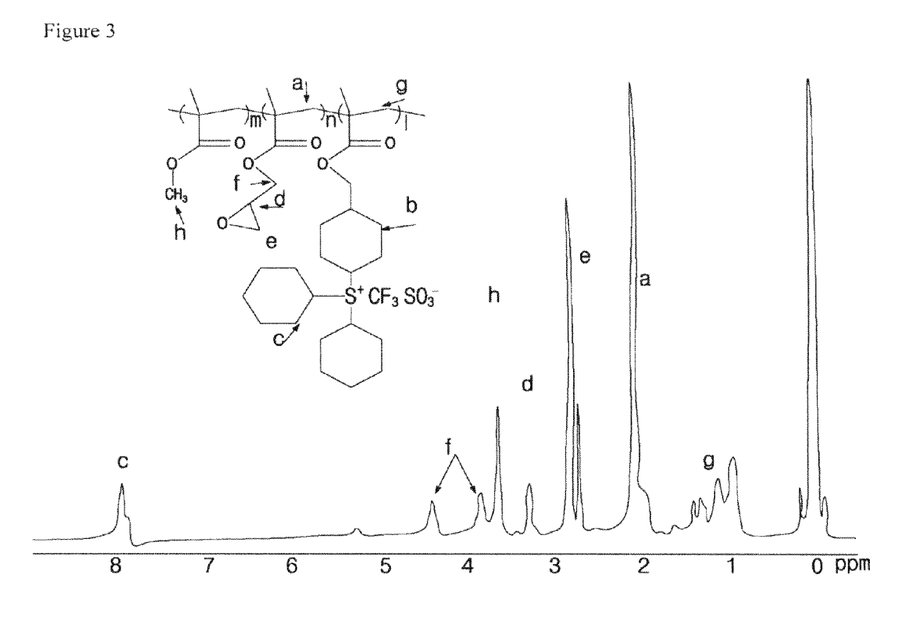
FIG. 3 is a $^1$H-NMR spectrum of a terpolymer synthesized in Example 3.
Figure 4:
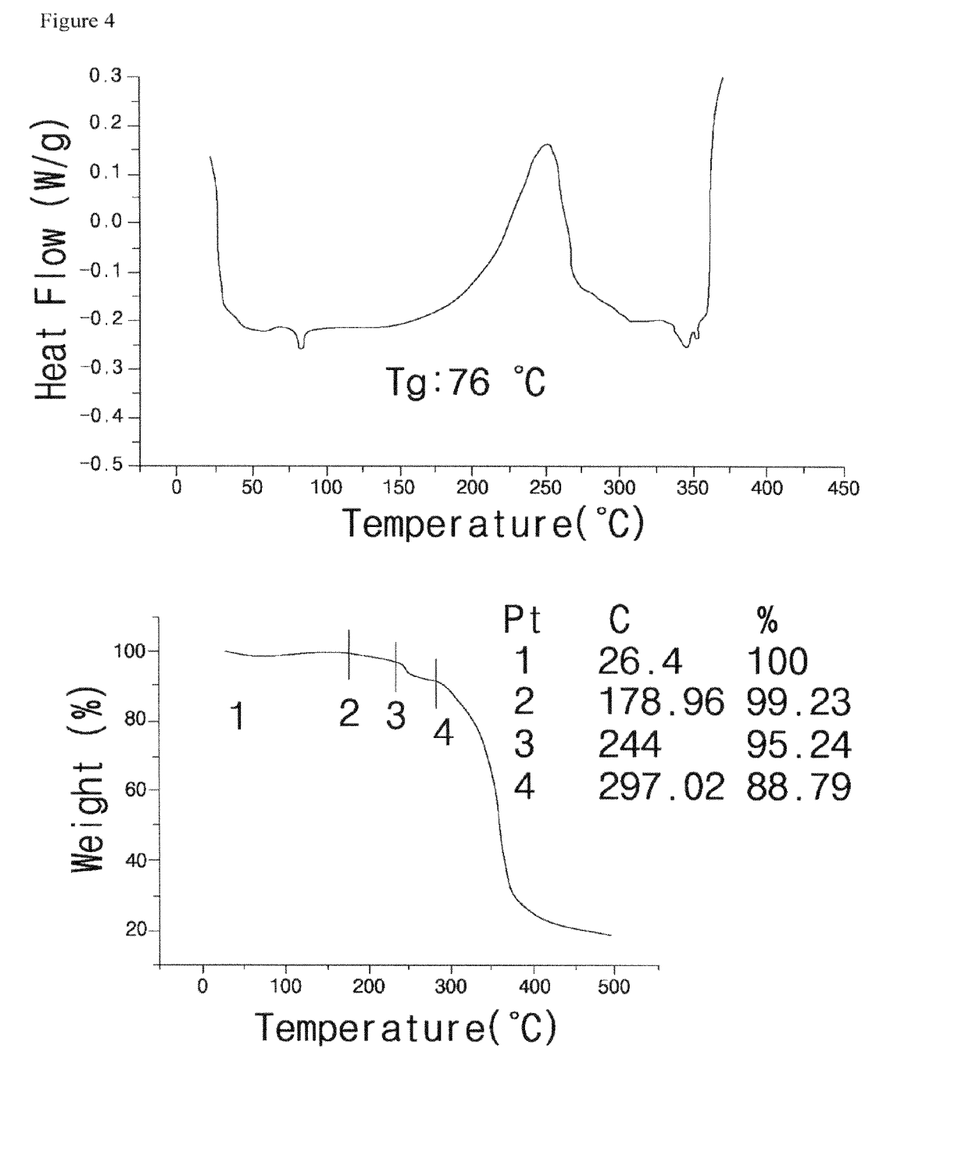
FIG. 4 shows the results of thermogravimetric analysis (DSC and TGA) of a terpolymer synthesized in Example 3.

FIGS. 3 and 4 show a $^1$H-NMR spectrum and the results of thermogravimetric analysis (DSC and TGA) of the terpolymer, respectively.

Comparative Example 1

Synthesis of Copolymer Containing No Glycidylmethacrylate Monomer Units

In this example, a copolymer containing no glycidylmethacrylate monomer units was prepared as depicted in the following reaction. Specifically, poly(methylmethacrylate-co-4-diphenylsulfoniumtriflatebenzylmethacrylate) was synthesized.

1.35 g (13.5 mmol) of methylmethacrylate and 3.45 g (6.75 mmol) of the copolymer synthesized in Example 2 were dissolved in 300 mL of acetonitrile, and then 22 mg (0.27 mmol) of azobisisobutyronitrile was added to the solution. The mixture was stirred at reflux for 19 hours. The reaction solution was slowly poured into isopropanol. The precipitate was filtered and dried under vacuum to afford poly(methylmethacrylate-co-4-diphenylsulfoniumtriflatebenzylmethacrylate) in a yield of 87%.

Experimental Example 1

The resist terpolymer synthesized in Example 3 and the copolymer synthesized in Comparative Example 1 were tested for crosslinking ability under the following conditions:
Thickness: 10 nm
Lithography speed: 600 μm/sec
PEB: 120° C./90 sec
Development: IPA/H$_2$O=7/3
The results are shown in FIGS. 5 and 6.

Figure 5:
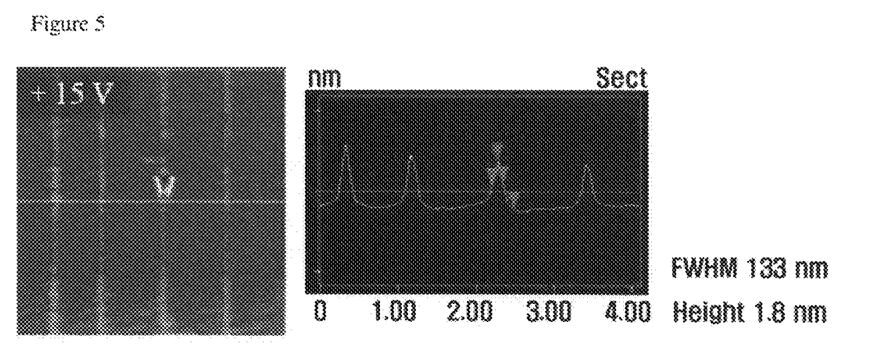
FIG. 5 graphically shows the crosslinking tendency of a terpolymer synthesized in Example 3.
Figure 6:
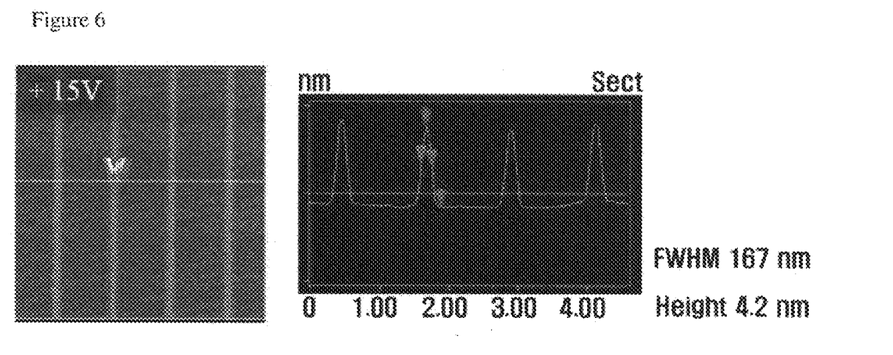
FIG. 6 graphically shows the crosslinking tendency of a copolymer containing no glycidylmethacrylate monomer units synthesized in Comparative Example 1.

The graphs of FIGS. 5 and 6 show that the terpolymer containing glycidylmethacrylate monomer units was more easily crosslinked at a lower voltage than the copolymer containing no glycidylmethacrylate monomer units. Further, shaper and narrower peaks were observed in the terpolymer of Example 3 than in the copolymer of Comparative Example 1. From these results, it can be concluded that a fine pattern with higher resolution and smaller line width can be realized when the terpolymer of Example 3 is used as a resist than when the copolymer of Comparative Example 1 is used.

[Industrial Applicability]

As is apparent from the above description, the copolymer containing photoacid generators according to the present invention can be used as a resist for AFM lithography or e-beam lithography. In addition, the copolymer of the present invention is suitable for use as an e-beam resist with good resolution. Particularly, the resist copolymer of the present invention is very useful in lithographic processes for the fabrication of semiconductor devices, including semiconductor integrated circuit devices and TFT-LCDs. Furthermore, the copolymer of the present invention can realize a high-resolution hyper-fine pattern, which is required in exposure processes for high integration of devices.

The invention claimed is:

1. A resist copolymer containing photoacid generators, represented by:

wherein $R_1$ and $R_2$ are independently selected from $C_1$-$C_6$ alkylcarbonyl, aldehyde, cyano, nitro and phenyl groups, $R_3$ is a $C_1$-$C_{20}$ linear, branched or cyclic alkyl group, $R_5$, $R_6$ and $R_7$ are independently a hydrogen atom or a $C_1$-$C_{20}$ linear, branched or cyclic alkyl group, n is an integer from 0 to 20, and the sum of x, y and z is 1.

2. The resist copolymer of claim 1, wherein the resist copolymer is represented by Formula 3:

wherein x+y+z=1.

3. The resist copolymer of claim 1, wherein the resist copolymer is a resist for AFM lithography or e-beam lithography.

* * * * *